(12) United States Patent
Nishiura et al.

(10) Patent No.: US 7,644,852 B2
(45) Date of Patent: Jan. 12, 2010

(54) BONDING APPARATUS, BALL FORMING DEVICE IN SAID BONDING APPARATUS, AND BALL FORMING METHOD USING SAID BONDING APPARATUS

(75) Inventors: Shinichi Nishiura, Musashimurayama (JP); Fumio Miyano, Musashimurayama (JP); Masayuki Horino, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 67 days.

(21) Appl. No.: 11/824,863

(22) Filed: Jul. 3, 2007

(65) Prior Publication Data
US 2008/0035709 A1 Feb. 14, 2008

Related U.S. Application Data

(63) Continuation-in-part of application No. 11/704,093, filed on Feb. 8, 2007.

(30) Foreign Application Priority Data

Jul. 3, 2006 (JP) .............................. 2006-182907
Jun. 8, 2007 (JP) .............................. 2007-153065

(51) Int. Cl.
| | |
|---|---|
| B23Q 15/00 | (2006.01) |
| B23Q 16/00 | (2006.01) |
| B23K 37/00 | (2006.01) |
| B23K 5/00 | (2006.01) |
| B23K 1/06 | (2006.01) |
| B23K 5/20 | (2006.01) |
| B23K 20/10 | (2006.01) |
| B23K 31/00 | (2006.01) |
| B23K 35/38 | (2006.01) |
| F01N 7/18 | (2006.01) |

(52) U.S. Cl. .............................. 228/9; 228/4.5; 228/18; 228/110.1; 228/176; 228/180.5; 228/219; 228/220

(58) Field of Classification Search .............. 228/110.1, 228/4.5, 180.5, 904, 219, 220, 176, 18, 9
See application file for complete search history.

(56) References Cited

U.S. PATENT DOCUMENTS 6,234,376 B1    5/2001    Wicon (Continued)

FOREIGN PATENT DOCUMENTS

JP    59-219935    12/1984

(Continued)

*Primary Examiner*—Jerry Lorengo
*Assistant Examiner*—Eli Mekhlin
(74) *Attorney, Agent, or Firm*—William L. Androlia; H. Henry Koda

(57) ABSTRACT

A ball forming device and method used in a bonding apparatus, including a bonding arm, a capillary attached to the bonding arm, an electronic flame off probe for forming a ball at the tip of a wire passing through the capillary, and a gas atmosphere forming unit for bringing the vicinity of the tip end of the wire into a gas atmosphere. The gas atmosphere forming unit is made of an inner wall element and an outer wall element with a hollow space section in between. The bonding arm side of the inner wall element has an inside open space which is wider than the portion of the bonding arm where the capillary is attached, and gas ejection ports are formed in the inner wall element. A gas supply pipe is connected to the outer wall element to supply, for instance, a reducing gas into the hollow space section.

4 Claims, 5 Drawing Sheets

U.S. PATENT DOCUMENTS

2005/0109815 A1 * 5/2005 Kakutani .................. 228/9

FOREIGN PATENT DOCUMENTS

| JP | 60-33440 | 3/1985 |
| JP | 60-211951 | 10/1985 |
| JP | 60-213038 | 10/1985 |
| JP | 61-296731 | 12/1985 |
| JP | 60244034 A * | 12/1985 |
| JP | 60-010249 | 1/1986 |
| JP | 61296731 A * | 12/1986 |
| JP | 62-62436 | 4/1987 |
| JP | 62-62438 | 4/1987 |
| JP | 4-28136 | 5/1992 |

* cited by examiner

BONDING APPARATUS, BALL FORMING DEVICE IN SAID BONDING APPARATUS, AND BALL FORMING METHOD USING SAID BONDING APPARATUS

CROSS REFERENCE TO RELATED APPLICATIONS

This is a continuation-in-part application of application Ser. No. 11/704,093 filed Feb. 8, 2007.

BACKGROUND OF THE INVENTION

The present invention relates to bonding apparatuses, ball forming devices used in the bonding apparatuses, and ball forming methods using the bonding apparatuses, and in particular, to a bonding apparatus, a ball forming device used in the bonding apparatus, and a ball forming method using the bonding apparatus.

Gold wire is commonly used as a bonding wire (merely called, "wire") for connecting between a first bonding point and a second bonding point and for forming bumps. However, in order to reduce manufacturing costs, attempts have been made to use copper wires or aluminum wires. However, these wires cause oxidation to readily occur when forming a ball at a tip end of the wire. So as to prevent oxidations, various structures have been proposed, and Japanese Patent Application Examined Publication Disclosure No. H04 (1992)-28136 B, which is corresponding to Japanese Patent Application Unexamined Publication Disclosure S60 (1985)-244034 A, for example, discloses a ball forming device that prevents wire oxidation in a wire bonding apparatus.

In the ball forming device of Japanese Patent Application Examined Publication Disclosure No. H04 (1992)-28136 B, a cylindrical cover is provided so that it surrounds the capillary, and a reducing gas or inactive gas is supplied inside this cylindrical cover to bring the vicinity of a tip end of the wire passing through the capillary into a gas atmosphere. A ball is formed at the tip end of the wire by an electric discharge from an electronic flame off probe in this gas atmosphere.

In this ball forming device of Japanese Patent Application Examined Publication Disclosure No. H04 (1992)-28136, though not shown in its drawings, the upper part of the capillary is secured to a bonding arm, and the work to be bonded is pressed against a working platform by a pressing arm that moves up and down, vertically. For this reason, in view of the length (or height) of the capillary, the cylindrical cover needs to have a height that does not interfere with the pressing arm that moves up and down and the thickness of the bonding arm. Generally, the length of the capillary is 11.1 mm, the length by which the capillary is secured to the bonding arm is 4 mm, and the thickness and the distance of the up-and-down motion of the pressing arm is 4.7 mm; accordingly, the height of the cylindrical cover is as thin as approximately 2 mm or so. With such a very thin cylindrical cover, it is very difficult to form a gas atmosphere inside the cylindrical cover. Furthermore, the capillary moves up and down at high speed inside the cylindrical cover, and it also moves in the directions of X and Y axes (or horizontally); accordingly, with such a very thin cylindrical cover, the gas can easily escape. Therefore, in order to make the cylindrical cover long and form a sufficient gas atmosphere inside this cylindrical cover, it is necessary to make the length of the capillary substantially long; however this is difficult to accomplish because when the capillary has a substantial length, then the resonance point of the capillary brought by an ultrasonic wave oscillator tends to change so that smooth ultrasonic transmission is hindered.

BRIEF SUMMARY OF THE INVENTION

Accordingly, an object of the present invention is to provide a bonding apparatus, a ball forming device used in the bonding apparatus, and a ball forming method using the bonding apparatus, in which the vicinity of a tip end of a bonding wire can be brought into a sufficient gas atmosphere without making the capillary substantially longer than it is actually necessary. Another object of the present invention is to provide a bonding apparatus capable of supplying sufficient gas for forming a gas atmosphere at a tip end of a bonding wire at which a ball is formed. Any of devices as stated below accomplishes at least one of the above objects.

A ball forming device used in a bonding apparatus according to the present invention comprises: a bonding arm; a capillary attached to one end of the bonding arm; an electronic flame off probe for forming a ball at a tip end of a wire passing through the capillary; and a gas atmosphere forming device provided in the bonding apparatus to bring a tip end part of the wire into a gas atmosphere; and in the present invention, the gas atmosphere forming device includes:

an inner wall element having a plurality of gas ejection ports, a bonding arm side of said inner wall element having an inside open space greater in width than a portion of the bonding arm where the capillary is attached to, an outer wall element secured to the inner wall element with a hollow space section in between, and a gas supply pipe connected to the outer wall element to supply a gas into the hollow space section.

Further, the ball forming device used in the bonding apparatus according to the present invention is such that the gas ejection ports provided in said inner wall element are formed so that a volume of gas ejection is greater at an open end side of said inside open space than at a deep end side thereof.

Further, the ball forming device used in the bonding apparatus according to the present invention is such that the inner wall element is, in lateral cross-section, of a shape selected from a letter U and a letter C.

Furthermore, the above object is accomplished by unique steps of the present invention for a ball forming method using the bonding apparatus, and this method comprises the steps of:

providing a bonding apparatus that comprises;
   a bonding arm,
   a capillary attached to one end of the bonding arm,
   an electronic flame off probe for forming a ball at a tip end of a wire passing through the capillary, and
   a gas atmosphere forming device provided in the bonding apparatus to bring a tip end part of the wire into a gas atmosphere, the gas atmosphere forming device including
      an inner wall element having a plurality of gas ejection ports, a bonding arm side of said inner wall element having an inside open space greater in width than a portion of the bonding arm where the capillary is attached to,
      an outer wall element secured to the inner wall element with a hollow space section in between, and
      a gas supply pipe connected to the outer wall element to supply a gas into the hollow space section,
supplying a gas from the gas supply pipe into the hollow space section;
ejecting the gas through the gas ejection ports into the inside open space;
maintaining the vicinity of the tip end part of the wire in the inside open space in a gas atmosphere; and forming the ball at the tip end of the wire by electrical discharge from the electronic flame off probe, after the tip end of the wire passing through the capillary being moved up and down so as to correspond to the electronic flame off probe.

Further, the bonding apparatus according to the present invention comprises:

a capillary attached to a tip end of a bonding arm;

a peripheral wall for forming a gas atmospheric space surrounding the capillary, the peripheral wall having an opening portion that opens on a side of the bonding arm, and a plurality of gas ejection ports in an inner wall surface that surrounds the capillary so as to enclose the capillary toward the bonding arm and faces toward the capillary;

an electronic flame off probe for forming a ball at a tip end of a wire passing through the capillary, the electronic flame off probe being inserted into the gas atmospheric space from a bottom portion of the peripheral wall toward a tip end of the capillary; and a supply channel for supplying a gas atmosphere, the supply channel being inserted into the gas atmospheric space from a bottom portion of the peripheral wall toward the tip end of the capillary, and the supply channel being integrally provided with the electronic flame off probe.

Further, in the bonding apparatus according to the present invention, it is preferable that the supply channel and the electronic flame off probe are provided with a predetermined fixed positional relation with respect to the peripheral wall.

Further, in the bonding apparatus according to the present invention, it is preferable that the peripheral wall includes a retracting device allowing the peripheral wall to retract from the capillary.

Further, it is preferable that the bonding apparatus according to the present invention further includes a retracting device attached to a positioning camera provided with a certain positional relation with respect to the bonding arm, and movable with respect to the capillary between a gas atmosphere forming position and a retracting position.

According to any one of the above structures, in a ball forming device used in a bonding apparatus, the inner wall element has a plurality of gas ejection ports, and a bonding arm side of said inner wall element having an inside open space is greater in width than a portion of the bonding arm where the capillary is attached to. Accordingly, the capillary can be moved up and down inside the gas atmosphere forming device or in its inside open space even if the length (or the vertical length or the height) of the gas atmosphere forming device is substantially great (or the gas atmosphere forming device is made large in its vertical direction). Because the up-and-down or vertical length (or height) of the gas atmosphere forming device can be made great in this manner in the present invention (or a capillary of any length can be used irrelevant to the size (vertical size) of the gas atmosphere forming device), the vicinity of the tip end of a wire can be maintained sufficiently in a gas atmosphere.

Further, according to any one of the above structures, the bonding apparatus includes the peripheral wall that forms a gas atmospheric space surrounding the capillary and that includes the gas ejection ports in the inner wall surface, the electronic flame off probe that is inserted into the gas atmospheric space from the lower portion of the peripheral wall toward the tip end of the capillary, and the supply channel that supplies the gas atmosphere and that is integrated with the electronic flame off probe and inserted into the gas atmospheric space from the lower portion of the peripheral wall toward the tip end of the capillary. With this configuration, even when the gas supply only from the peripheral wall is insufficient, it is possible, using the supply channel, to supply a sufficient amount of the gas for forming the gas atmosphere for the tip end of the bonding wire at which the ball is formed.

DETAILED DESCRIPTION OF THE INVENTION

First Embodiment

Figure 1A:
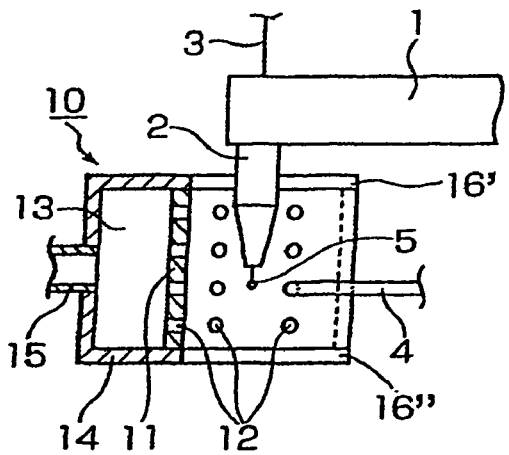
FIG. 1A shows, in vertical cross-section, a ball forming device according to one embodiment of the present invention used in a bonding apparatus.

First embodiment of a ball forming device used in a bonding apparatus, such as a wire bonding apparatus, of the present invention will be described with reference to FIGS. 1A through 1C and FIG. 2.

At one end of a bonding arm 1, a capillary 2 is secured with the other end of the capillary 2 being held on a bonding head (not shown) of a wire bonding apparatus; and a bonding wire ("wire") 3, which is a copper wire or an aluminum wire, passes through the capillary 2. At the tip end of the wire 3, a ball 5 is formed by electrical discharge produced by an electronic flame off probe 4. The electronic flame off probe 4 is secured to the bonding head, and this electronic flame off probe 4 is positioned so as to keep a predetermined distance, in a horizontal or XY direction, with respect to the capillary 2 and the tip end of the wire 3 passing the capillary 2.

A gas atmosphere forming device 10 that brings the vicinity of the tip end portion of the capillary 2, or the tip end of the wire projecting out of the tip end of the capillary 2, into a gas atmosphere is provided in an up-and-down driver (not shown) for the capillary 2. The gas atmosphere forming device 10 is secured either to a bonding head (not shown) that holds the bonding arm 1 in an up-and-down movable fashion or to an XY table that moves the bonding head in X and Y axes directions (or horizontally). In addition, an imaging device (camera) that takes images of a work is provided on the bonding head, and thus the gas atmosphere forming device 10 can be attached to a housing (not shown) that has the imaging device therein.

The gas atmosphere forming device 10 is comprised of an inner wall element 11 and an outer wall element 14. The bonding arm 1 side of the inner wall element 11 (or the portion of the inner wall element 11 that faces the capillary 2 or the bonding arm 1) extends up and down (vertically) for a predetermined length or height, and it is formed with an inside open space 10' that opens with a larger width than the width of the portion of the bonding arm 1 where the capillary 2 is attached to; and in addition, a plurality of gas ejection ports 12 are formed in this inner wall element 11. More specifically, the lateral (horizontal) cross-section of the inner wall element 11 is in the shape of a letter U or a letter C, and the inside open space 10' is located within this U- or C-shaped portion of the inner wall element 11.

On the outside of this inner wall element 11, the outer wall element 14, which, like the inner wall element 11, extends up and down (vertically) to have a predetermined height that is substantially the same as the height of the inner wall element 11, is secured, so that the inner wall element 11 and the outer wall element 14 form a hollow space section 13 in between. The upper edges of the inner and outer wall elements 11 and 14 are connected to each other with a top plate 16' and the bottom edges of the inner and outer wall elements 11 and 14 are connected to each other with a bottom plate 16", so that the gas atmosphere forming device 10 is formed as an enclosed compartment with the inner wall element 11, outer wall element 14, top plate 16' and bottom plate 16", having the hollow space section 13 therein.

To the outer wall element 14, a gas supply pipe 15 is connected so that a reducing gas or inactive gas is supplied into the hollow space section 13.

The above-described gas atmosphere forming device 10 is made of a resin material comprising an electrically insulating material.

The operation of the gas atmosphere forming device 10 will be described below.

Figure 1B:
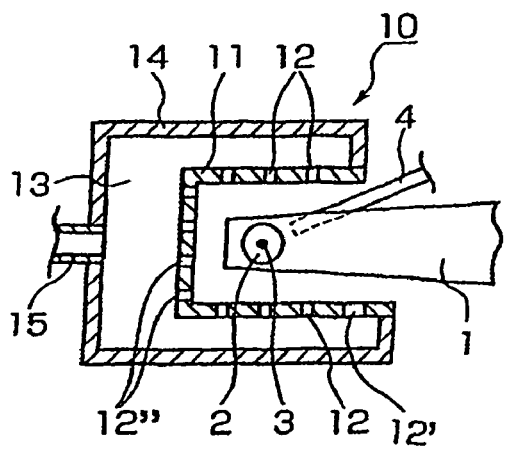
FIG. 1B is the ball forming device shown in lateral section.

In the condition diagrammed in FIGS. 1A and 1B, when, with the capillary 2, particularly the tip end of the wire 3 passing through the capillary 2, in the inside open space 10' of the inner wall element 11, a reducing gas or inactive gas is supplied from the gas supply pipe 15 into the hollow space section 13, this reducing gas or inactive gas is then ejected through the gas ejection ports 12 to the outside of the hollow space section 13 or into the inside open space 10'. As a result, the vicinity of the tip end part of the wire 3, which is in the inside open space 10', is brought into and maintained in a gas atmosphere. When the ball 5 is to be formed, after the tip end of the wire 3 passing through the capillary 2 is moved up and down so as to correspond with the electronic flame off probe 4, an electric discharge is produced by the electronic flame off probe 4, thus forming the ball 5 at the tip end of the wire 3. In this case, since the vicinity of the tip end part of the wire 3 is in a gas atmosphere of the reducing gas or inactive gas, oxidation of the ball 5 is prevented.

Figure 1C:
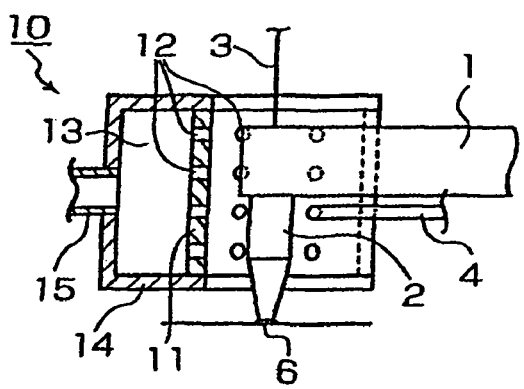
FIG. 1C is a vertical section thereof with the capillary descended.
Figure 2:
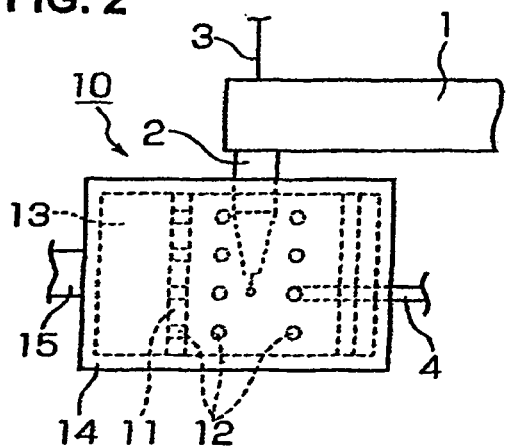
FIG. 2 is a front elevational view of the ball forming device shown in FIG. 1A.

Next, as shown in FIG. 1C, the capillary 2 descends, and the ball 5 is bonded to a first bonding point 6. Then, the capillary 2 ascends and moves in the direction of a second bonding point (not shown), thus forming a wire loop (not shown), and then the wire 3 is connected to the second bonding point. During this operation, since the gas atmosphere forming device 10 is secured to the bonding head or to an XY table, it is moved in the direction of X and Y axes (or moved in the horizontal and vertical directions) together with the capillary 2.

Needless to say, the gas atmosphere forming device 10 can be used for bump forming processes in addition to the above-described wire bonding processes.

The inner wall element 11 of the gas atmosphere forming means 10 has such a structure that the bonding arm 1 side thereof is formed with the inside open space 10' which is greater in width than the portion of the bonding arm 1 where the capillary 2 is attached to. Accordingly, the capillary 2 can be moved up and down inside the gas atmosphere forming device 10 or in its inside open space 10' even if the up-and-down or vertical length of the gas atmosphere forming device 10 is substantially long. Since the up-and-down length or the height of the gas atmosphere forming device 10 can be made large in this manner, it is possible to maintain the vicinity of the tip end part of the wire 3 in a sufficient gas atmosphere. In other words, the gas atmosphere forming device 10 can take any vertical size irrelevant to the size (particularly, the length) of the capillary used with.

In the above structure, the gas ejection ports 12 are made in exactly the same size for all of them; however, they can be formed so that the gas ejection volume is greater on the open end side of the inner wall element 11 than on the deep end side. In other words, as seen from FIG. 1B, gas ejection port(s) 12', on the open end side, which is on the right side in FIG. 1B, can be formed greater in size (diameter, for instance) than the ejection port(s) 12" on the deep end side, which is on the left side in FIG. 1B, so that the gas ejection volume is greater on the open end side than on the deep end side of the gas atmosphere forming device 10. With this structure, a gas curtain can be formed on the open end side area, and it will not be necessary to supply more reducing gas or inactive gas than necessary to the tip end part of the wire 3, which is preferable.

Second Embodiment

Figure 3:
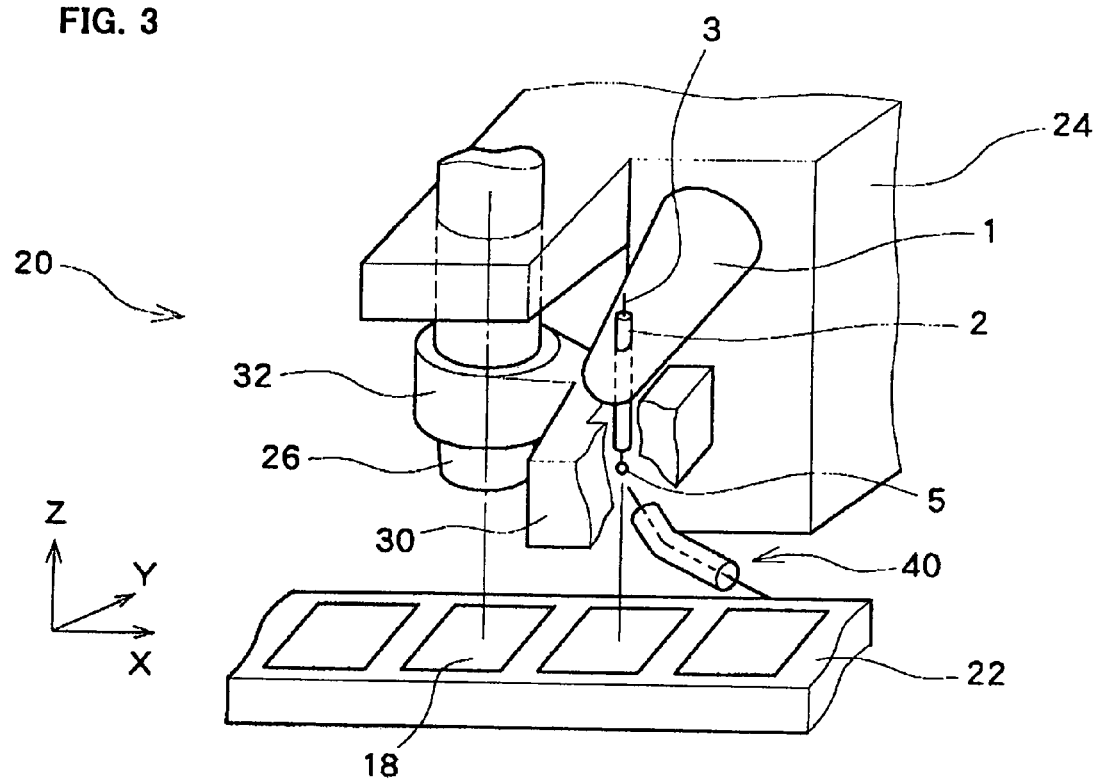
FIG. 3 shows a perspective view of the bonding apparatus of the embodiment according to the present invention.
Figure 4:
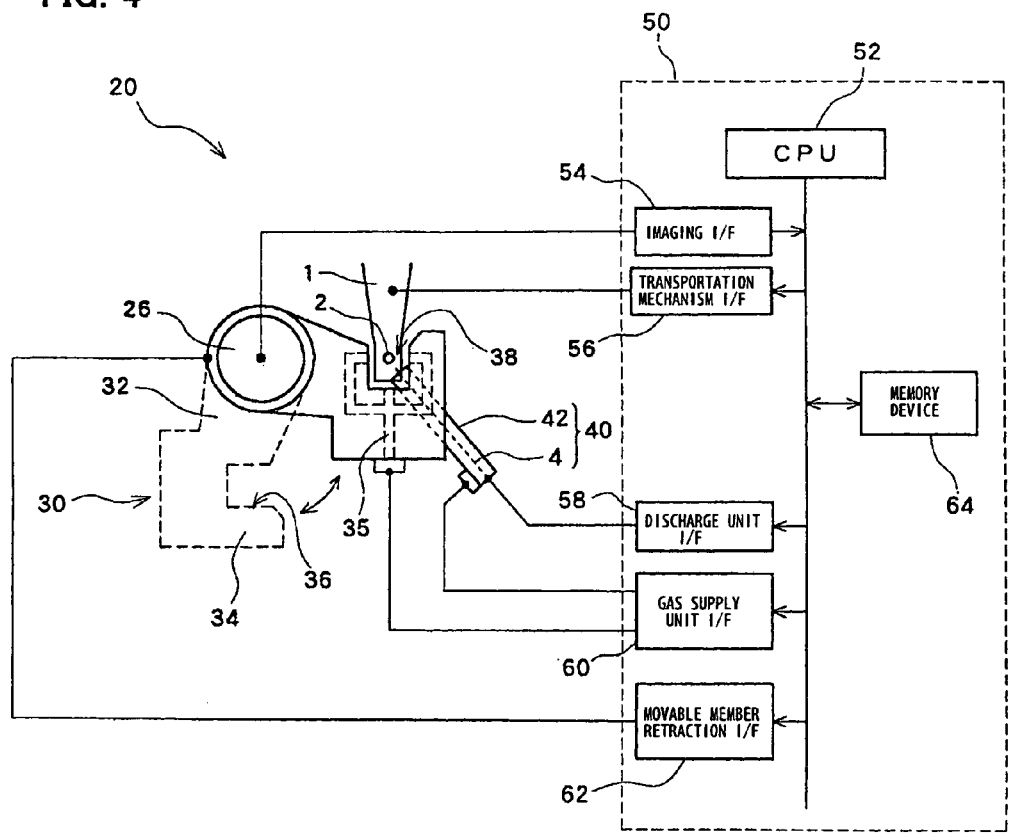
FIG. 4 shows a block diagram of the bonding apparatus of the embodiment according to the present invention.

The gas atmosphere forming device 10 described with reference to FIGS. 1A through 1C and FIG. 2 can be incorporated as it is in a wire bonding apparatus. FIG. 3 and FIG. 4 shows diagrams illustrating a configuration of a bonding apparatus 20 provided with the ball forming device and capable of supplying a gas for forming a gas atmosphere at the tip end of the bonding wire where a ball is formed. In the following description, like components are indicated by like numerals as in FIGS. 1A through 1C and FIG. 2, and details of such components are omitted. In the drawings, FIG. 3 shows a perspective view of a portion in the vicinity of the capillary 2 with which the gas atmosphere is formed in the bonding apparatus 20, and FIG. 4 shows a block diagram of the bonding apparatus 20.

The bonding apparatus 20, in particular, serves to supply a sufficient amount of reducing gas or inactive gas when forming a gas atmospheric space around the capillary 2. Specifically, the gas atmosphere forming device 10 as described with reference to FIGS. 1A through 1C and FIG. 2 is provided around the capillary 2 so as to extend along the vertical direction of the capillary 2, and opens with the large width on the bonding arm side. In other words, the gas atmosphere forming device 10 has openings on a top side, a down side, and the bonding arm side with respect to the capillary 2, and external air can enter through these openings due to a disturbance. Examples of such a disturbance includes wind caused by a fan provided for the bonding apparatus 20, and wind caused by the movement of the capillary 2 in X, Y, and Z directions at a high speed. As a result of such a disturbance, the gas atmosphere formed by the gas atmosphere forming device 10 can be partially replaced by the external air, and the space of the reducing gas or inactive gas atmosphere around the capillary 2 can be reduced.

The bonding apparatus 20 as described below is capable of supplying a sufficient amount of gas to form a gas atmospheric space around the capillary 2.

The bonding apparatus 20 is a wire bonding apparatus that serves to connect between, for example, a circuit board and a chip, using a thin metal wire. The bonding apparatus 20 is configured by a carrier 22 that holds a bonding object 18, a bonding head 24, a positioning camera 26 that is used for positioning of the bonding object 18, and a control unit 50 that controls operation of each component as a whole.

The bonding head 24 is provided with the bonding arm 1 having the capillary 2 at one end of the arm. Further, the bonding head 24 incorporates a Z motor that is not depicted, and serves to move the capillary 2 in the Z direction as shown in FIG. 3 according to an instruction from the control unit 50. Moreover, the bonding head 24 is mounted on the XY table that is not depicted, and serves to move the capillary 2 to a given position along a XY plane as shown in FIG. 3 to position the capillary 2 by means of movement of the XY table driven by the control unit 50.

The bonding arm 1 is an elongated arm shaped member pivotable about a pivot center provided for the bonding head 24. The capillary 2 is attached to one end of this arm shaped member, and the Z motor is attached to the other end. In this configuration, an axial direction of the pivot center is along the X axis as shown in FIG. 3. Consequently, the bonding arm 1 is, according to the drive of the Z motor, rotatable about the axis that is in parallel with the X axis. Rotation of the bonding arm 1 about the axis that is in parallel with the X axis causes the capillary 2 provided at the one end of the bonding arm 1 to move up and down substantially in the Z direction. In this manner, the capillary 2 is moved in the Z direction.

Further, the bonding arm 1 also serves to transmit ultrasonic energy produced by an ultrasonic wave oscillator to the capillary 2. This ultrasonic wave oscillator is not depicted in the drawings.

The capillary 2 is an elongated cylindrical tool through which the wire 3 passes. The capillary 2 serves as a bonding tool for bonding the wire 3 and the bonding object 18 by using the ultrasonic energy that is transmitted via the bonding arm 1 to press the tip end of the wire 3 onto the bonding object 18.

The wire 3 is a copper based thin wire for boding. A diameter of the wire 3 can be selected based on such as sizes of a pad and a lead terminal of the bonding object 18, and can be about 20 µm, for example.

Shapes of the wire 3 when bonded to the bonding object 18 are different between a first bonding point and a second bonding point. The first bonding point and the second bonding point are portions of a single wire 3 connecting to a pad and a lead terminal. The first bonding point is one of the pad and the lead terminal that is first to be bonded, and the second bonding point is the other of the pad and the lead terminal that is bonded next by feeding the wire 3 after the first bonding point.

At the first bonding point, the tip end of the wire 3 is melted by electrical discharge produced between the wire and the electronic flame off probe 4 to form the ball 5 in a round shape. A diameter of the ball 5 is greater than the diameter of the wire 3 that originally is. For instance, assuming the diameter of the wire 3 is originally about 20 µm in the above example, the diameter of the ball 5 of the tip end of the wire 3 at the first bonding point is on the order of 40 µm.

At the second bonding point, because the wire 3 fed after the first bonding point is bonded, the wire 3 as a thin wire with a constant diameter and not having a round shape is used for the bonding.

The positioning camera 26 is an imaging device having an optical axis at positional relation of a constant offset with respect to the Z axis of the capillary 2 of the bonding head 24. By using such positional relation of a constant offset, it is possible to observe a position of the bonding object 18 provided immediately below the optical axis of the positioning camera 26, to convert the observed position to a position of the bonding object 18 provided immediately below the Z axis of the capillary 2, and to realize the positioning between the capillary 2 and the bonding object 18.

Thus, the positioning camera 26 is integrated with the bonding head 24 or provided with the certain positional relation from the bonding head 24, and then mounted on the XY table.

A movable member 30 is attached to a mirror tube of the positioning camera 26, and is rotatable using an outer periphery of the mirror tube as a rotation guide. The movable member 30 is used for forming a reducing gas or inactive gas atmosphere about the capillary 2.

Next, a more detailed description is given about the portion in the vicinity of the movable member 30 with reference to FIG. 4. In the drawing, reference numerals used in FIGS. 1A through 1C, FIG. 2, and FIG. 3 are used in the description. FIG. 4 shows a plan view of the movable member 30, and only the bonding arm 1 and the capillary 2 are shown for the bonding head 24.

The movable member 30 is configured, as shown in FIG. 4, by a movable arm 32 and a peripheral wall 34. The movable member 30 is movable, under the control of the control unit 50, between a gas atmosphere forming position shown by a solid line and a retracting position shown by a dashed line in FIG. 4, by rotating along the outer periphery of the mirror tube of the positioning camera 26. The movable member 30 is positioned at the gas atmosphere forming position in a normal state, and moves to the retracting position in a case such as maintenance.

The peripheral wall 34 is an enclosure for forming a gas atmospheric space 38 around the capillary 2. The peripheral wall 34 encloses the capillary 2 so as to wrap around the capillary 2 and has an opening portion on the side of the bonding arm 1. The peripheral wall 34 includes the plurality of gas ejection ports 12 in an inner wall surface 36 that faces the capillary 2 (see FIG. 5). The peripheral wall 34 is provided with gas flow channels 35 inside the wall. One end of each gas flow channel 35 opens in the inner wall surface 36 as each gas ejection port 12, and the other end of each gas flow channel 35 is connected to a gas supply unit I/F (interface) 60 of the control unit 50 that is described later.

When viewing in a plan view, the peripheral wall 34 is in the shape of the letter U or letter C opening on the side of the bonding arm 1. Accordingly, the gas atmospheric space 38 is a space formed by enclosing the capillary 2 with the inner wall surface 36 and the end of the bonding arm 1. Such a gas atmospheric space 38 includes openings at top and bottom of the capillary 2, as well as a gap between the opening of the U-shaped inner wall surface 36 and the end of the bonding arm 1.

A flame off unit 40 is configured by the electronic flame off probe 4, a supply channel 42 that is an annular pipe provided around the electronic flame off probe 4. The electronic flame off probe 4 and the supply channel 42 are either integral, or fixed to each other with certain positional relation. Then, when the peripheral wall 34 is at the gas atmosphere forming position, the flame off unit 40 is positioned and fixed either to the XY table that is not shown or to another element that is mounted on the XY table, so as to be positioned in a certain positional relation with the peripheral wall 34, with the bonding head 24, and especially with the capillary 2.

The electronic flame off probe 4 is a member with a needle shaped tip end. The electronic flame off probe 4 serves to cause a discharge with the wire 3 projecting from the tip end of the capillary 2 to form the tip end of the wire 3 into the ball 5 in a round shape. The other end of the electronic flame off probe 4 is connected to a discharge unit I/F 58 of the control unit 50 that is described later.

Thus, when the capillary 2 is positioned at a height for ball formation, the electronic flame off probe 4 is positioned so that the tip end of the electronic flame off probe 4 is directed toward the tip end of the wire 3 projecting from the tip end of the capillary 2. When the peripheral wall 34 is at the gas atmosphere forming position, the positional relation becomes as follows. Specifically, the electronic flame off probe 4 is inserted into the gas atmospheric space 38 from a lower side of the peripheral wall 34 toward the tip end of the capillary 2, so that the tip end of the electronic flame off probe 4 is directed toward the tip end of the wire 3 that is inserted through the capillary 2.

The supply channel 42 is the annular pipe as described above that is fixed with the certain positional relation with the electronic flame off probe 4. The supply channel 42 serves to supply the reducing gas or inactive gas to the gas atmospheric space 38 via a path other than the gas ejection ports 12 of the peripheral wall 34. One end of the supply channel 42 opens at a position on a tip end side of the electronic flame off probe 4, and the other end of the supply channel 42 is connected to the gas supply unit I/F 60 of the control unit 50.

The control unit 50 serves to control the operations of components as a whole that structure the bonding apparatus 20. Here, in particular, the control unit 50 serves to controls to supply a sufficient amount of the reducing gas or inactive gas to the gas atmospheric space 38 surrounding the capillary 2, and to form a sufficient size of the inactive gas atmospheric space or reducing gas atmospheric space. Specifically, the control unit 50 controls to supply the reducing gas or inactive gas to the gas atmospheric space 38 from the gas ejection ports 12 of the peripheral wall 34, and, as necessary, to supply the reducing gas or inactive gas to the gas atmospheric space 38 via the supply channel 42.

The control unit 50 is configured by a CPU 52, an imaging I/F 54 connected to the positioning camera 26, a transportation mechanism I/F 56 connected to the bonding arm 1, the discharge unit I/F 58 connected to the flame off unit 40, the gas supply unit I/F 60 connected to the gas flow channel 35 of the peripheral wall 34, a movable member retraction I/F 62 connected to the movable member 30, and a memory device 64 that stores a program and such. These components are connected to each other via an internal bus. The above control unit 50 can be structured by a computer suitable for controlling the bonding and a group of suitable peripheral circuits.

The imaging I/F 54 serves to convert an image taken by the positioning camera 26 into data, and to supply the data to the control unit 50. Specifically, the imaging I/F 54 can be structured by an image processing circuit or such.

The transportation mechanism I/F 56 serves to move the bonding arm 1 in the Z direction. Specifically, the transportation mechanism I/F 56 can be structured by such as a drive circuit of the Z motor for the bonding arm 1.

The discharge unit I/F 58 serves to cause a discharge for ball formation between the tip end of the electronic flame off probe 4 and the tip end of the wire 3. Specifically, the discharge unit I/F 58 can be structured by a high voltage generating circuit or such.

The gas supply unit I/F 60 serves to supply the reducing gas or inactive gas to the gas flow channel 35 of the peripheral wall 34. Specifically, the gas supply unit I/F 60 can be structured by a gas source, an appropriate adjustment device such as a regulator, and such as a control circuit that controls these components. Here, the gas source is such as a cylinder or tank containing the reducing gas or inactive gas. Examples of the inactive gas here broadly include gaseous bodies that suppress oxidation such as in the ball formation of the wire 3, and an inactive gas in a narrow sense such as argon gas can be used in addition to nitrogen gas, for example.

The movable member retraction I/F 62 serves to rotate the movable member 30 about the outer periphery of the mirror tube of the positioning camera 26, and to move the movable member 30 between the gas atmosphere forming position and the retracting position shown by the dashed line. Specifically, the movable member retraction I/F 62 can be structured by a movable member driving circuit or such.

Figure 5:
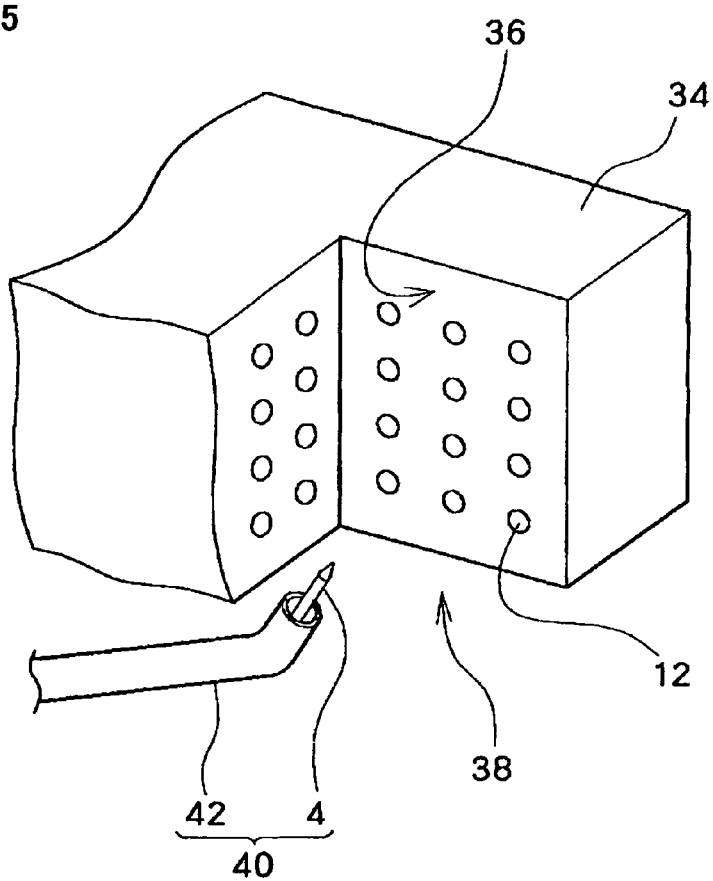
FIG. 5 shows a cutaway view in the vicinity of a gas atmospheric space in the embodiment according to the present invention.

FIG. 5 shows a cutaway view of a portion of the gas atmospheric space 38, illustrating positional relation between the peripheral wall 34 and the flame off unit 40. As shown in the drawing, the inner wall surface 36 of the peripheral wall 34 includes the plurality of the gas ejection ports 12. The flame off unit 40 is provided so that the needle shaped tip end of the electronic flame off probe 4 as one end of the flame off unit 40 and the opening of the supply channel 42 are facing toward an interior of the gas atmospheric space 38 from the lower portion of the peripheral wall 34.

Figure 6A:
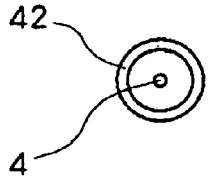
FIG. 6A is a side elevational view of the flame off unit in the embodiment according to the present invention, FIG. 6B being a cross-sectional view thereof.
Figure 6B:
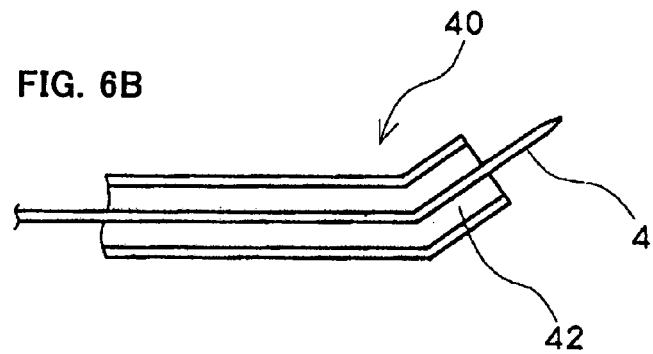

FIGS. 6A and 6B respectively show a side elevational view and a cross-sectional view illustrating a configuration of the flame off unit 40. As shown in the drawings, the flame off unit 40 has a configuration such that a conductor line is disposed in a circular pipe. The conductor line structures the electronic flame off probe 4, and an annular portion between the circular pipe and the conductor line structures the supply channel 42.

Figure 7A:
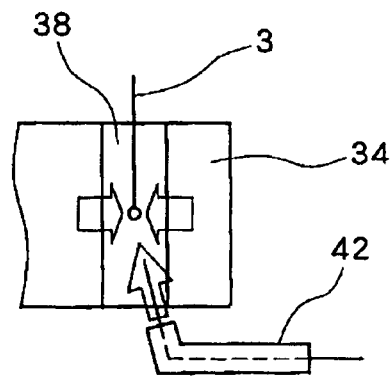
FIG. 7A is a back view viewed from the side of the bonding arm illustrating a condition of the gas atmospheric space in the embodiment according to the present invention, FIG. 7B being a plan view thereof, and FIG. 7C being a side elevational view thereof.
Figure 7B:
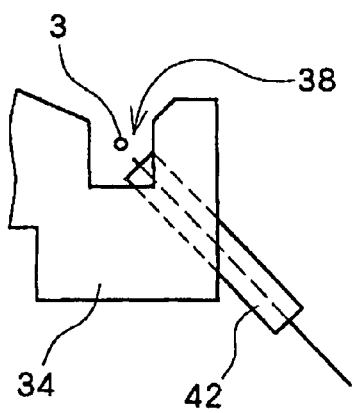
Figure 7C:
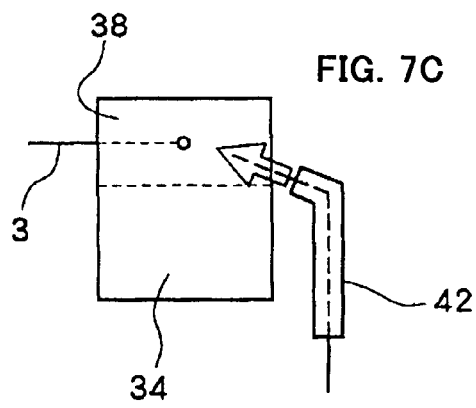

FIGS. 7A through 7C show how the reducing gas or inactive gas is supplied to the gas atmospheric space 38, under the control of the control unit 50, via both the peripheral wall 34 and the supply channel 42. In the description below, like components are indicated by like numerals as shown in FIGS. 1A through 6B, and details of such components are omitted. Further, in the description below, the same reference numerals as used in FIGS. 1 through 6 are used. In the drawings, such as the bonding arm 1 and the capillary 2 are not depicted. FIG. 7A is a back view viewed from the side of the bonding arm 1, FIG. 7B is a plan view, and FIG. 7C is a side elevational view. As shown in the drawings, from the peripheral wall 34, the inactive gas or reducing gas is supplied horizontally with respect to the gas atmospheric space 38, and, from the supply channel 42, the reducing gas or inactive gas is supplied upward from the lower portion with respect to the vertical (up and down) direction of the gas atmospheric space 38.

Figure 8A:
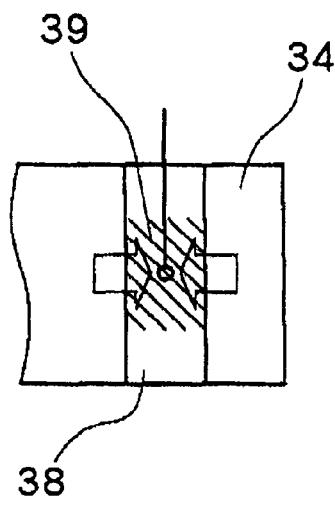
FIG. 8A shows a case in which the external air, i.e. air containing oxygen enters into the gas atmospheric space from the outside due to disturbance, FIG. 8B showing a case in which the external air enters into the gas atmospheric space due to the disturbance, but the reducing gas or inactive gas is also supplied from a supply channel.
Figure 8B:
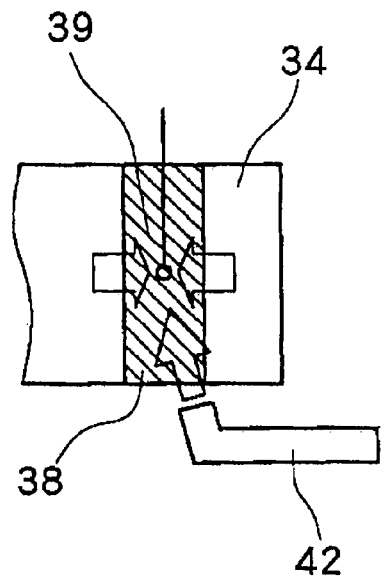

The description is given regarding the above configuration with reference to FIGS. 8A and 8B. In the description below, like components are indicated by like numerals as shown in FIGS. 1A through 7C, and details of such components are omitted. Further, in the description below, the same reference numerals as used in FIGS. 1 through 7 are used.

FIG. 8A shows a case in which the external air, i.e. air containing oxygen enters the gas atmospheric space 38 from outside due to the disturbance, assuming that the reducing gas or inactive gas is supplied only from the peripheral wall 34 and the supply channel 42 is not present, for comparison. In the drawing, the reducing gas or inactive gas is supplied only from the peripheral wall 34, the air entering due to the disturbance narrows an area of a gas filling space 39 filled with the reducing gas or inactive gas in the gas atmospheric space 38. The air enters due to the disturbance through the opening of the gas atmospheric space 38. In the example shown in FIG. 8A, the air enters from a top side and a bottom side of the gas atmospheric space 38. Accordingly, the gas filling space 39 is narrowed and limited to a central portion of the gas atmospheric space 38.

FIG. 8B shows a case in which the external air enters due to the disturbance, but the reducing gas or inactive gas is also supplied from the supply channel 42. In the drawing, the reducing gas or inactive gas is supplied upward from the bottom of the gas atmospheric space 38 through the supply channel 42 that is separate from the supply of the reducing gas or inactive gas from the peripheral wall 34. Accordingly, the gas filling space 39 can spread for an entirety of the gas atmospheric space 38.

In this manner, supplying the reducing gas or inactive gas via the supply channel 42 allows the gas filling space 39 to be spread over the entire gas atmospheric space 38. With this configuration, the formation of the ball 5 at the tip end of the wire 3 can be performed in the gas atmospheric space 38 to which a sufficient amount of the reducing gas or inactive gas is supplied. Thus, it is possible to suppress the oxidization and such of the wire 3 and the ball 5 by the formation of the ball 5 of the tip end of the wire 3.

As described above, the atmosphere of the reducing gas or inactive gas is needed when the ball 5 is formed at the tip end of the wire 3. Therefore, the control unit 50 can, synchronously with providing a discharge instruction for the ball formation for the discharge unit I/F 58, provide an instruction for the gas supply unit I/F 60 to supply the reducing gas or inactive gas to the supply channel 42 in addition to the peripheral wall 34. Here, "synchronously" indicates not only a case in which the two instructions temporally coincide, but also delayed sync relation where one instruction is conducted with a certain delay time with respect to the other instruction. For example, the control unit 50 can provides the gas supply instruction for the gas supply unit I/F 60 prior to the discharge instruction, and then have the actual discharge instruction be performed after a certain delay with which the gas filling space is sufficiently formed in the gas atmospheric space 38.

The invention claimed is:

1. A bonding apparatus comprising:
a capillary attached to a tip end of a bonding arm;
a peripheral wall for forming a gas atmospheric space surrounding the capillary, the peripheral wall having an opening portion that opens on a side of the bonding arm, and a plurality of gas ejection ports in an inner wall surface that surrounds the capillary so as to enclose the capillary toward the bonding arm and faces toward the capillary;
an electronic flame off probe for forming a ball at a tip end of a wire passing through the capillary, the electronic flame off probe being inserted into the gas atmospheric space from a bottom portion of the peripheral wall toward a tip end of the capillary;
a supply channel for supplying a gas atmosphere, the supply channel being inserted into the gas atmospheric space from a bottom portion of the peripheral wall toward the tip end of the capillary, and the supply channel being integrally provided with the electronic flame off probe; and wherein
a retracting device is attached to a positioning camera provided with a certain positional relation with respect to the bonding arm, and movable with respect to the capillary between a gas atmosphere forming position and a retracted position;
the supply channel and the electronic flame off probe are provided with a predetermined fixed positional relation with respect to the peripheral wall; and
the peripheral wall includes a retracting device allowing the peripheral wall to retract from the capillary.

2. The bonding apparatus according to claim 1, wherein a length of a capillary is substantially 11.1 mm, a length by which the capillary is secured to the bonding arm is substantially 4 mm and a thickness and a distance of an up and down motion of a pressing arm is substantially 4.7 mm.

3. The bonding apparatus according to claim 1, wherein a bonding arm side of said inner wall has an inside open space greater in width than a portion of the bonding arm where the capillary is attached.

4. The bonding apparatus according to claim 1, wherein said supply channel comprises an annular pipe with said flame off probe provided therein and said gas is supplied to said annular pipe to supply said gas atmosphere in addition to said plurality of gas ejection ports.

* * * * *